United States Patent
Balasekaran et al.

(10) Patent No.: US 10,396,222 B2
(45) Date of Patent: Aug. 27, 2019

(54) INFRARED LIGHT-RECEIVING DEVICE

(71) Applicant: SUMITOMO ELECTRIC INDUSTRIES, LTD., Osaka (JP)

(72) Inventors: Sundararajan Balasekaran, Yokohama (JP); Hiroshi Inada, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/913,385

(22) Filed: Mar. 6, 2018

(65) Prior Publication Data

US 2018/0315873 A1 Nov. 1, 2018

(30) Foreign Application Priority Data

Apr. 28, 2017 (JP) .................. 2017-090553

(51) Int. Cl.
*H01L 31/0304* (2006.01)
*H01L 31/0352* (2006.01)
*H01L 31/18* (2006.01)
*H01L 31/109* (2006.01)

(52) U.S. Cl.
CPC .............. *H01L 31/035236* (2013.01); *H01L 31/03042* (2013.01); *H01L 31/03046* (2013.01); *H01L 31/109* (2013.01); *H01L 31/1844* (2013.01)

(58) Field of Classification Search
CPC ................................ H01L 31/03042
USPC ...................................... 257/21
See application file for complete search history.

(56) References Cited

U.S. PATENT DOCUMENTS

2011/0164136 A1* 7/2011 Nagai .................. B82Y 20/00
348/148

OTHER PUBLICATIONS

Chen, Baile, et al., "SWIR/MWIR InP-Based p-i-n Photodiodes with InGaAs/GaAsSb Type-II Quantum Wells", *IEEE Journal of Quantum Electronics*, vol. 47, No. 9, Sep. 2011.

* cited by examiner

*Primary Examiner* — Hsin Yi Hsieh
(74) *Attorney, Agent, or Firm* — Smith, Gambrell & Russell, LLP

(57) ABSTRACT

An infrared light-receiving device includes an optical absorption layer disposed on a principal surface of a substrate and an optical filter disposed on the optical absorption layer, the optical filter including first, second, and third semiconductor regions that are arranged in that order in a direction from the optical absorption layer to the optical filter, each of the first, second, and third semiconductor regions including an n-type InGaAs layer. The optical absorption layer includes a type-II superlattice structure. The first semiconductor region contains an n-type impurity with a concentration of $2.0 \times 10^{19}$ $cm^{-3}$ or more. The third semiconductor region contains an n-type impurity with a concentration of $3.0 \times 10^{18}$ $cm^{-3}$ or less and $8.0 \times 10^{17}$ $cm^{-3}$ or more. The second semiconductor region contains an n-type impurity with a concentration between the impurity concentration of the first semiconductor region and the impurity concentration of the third semiconductor region.

6 Claims, 11 Drawing Sheets

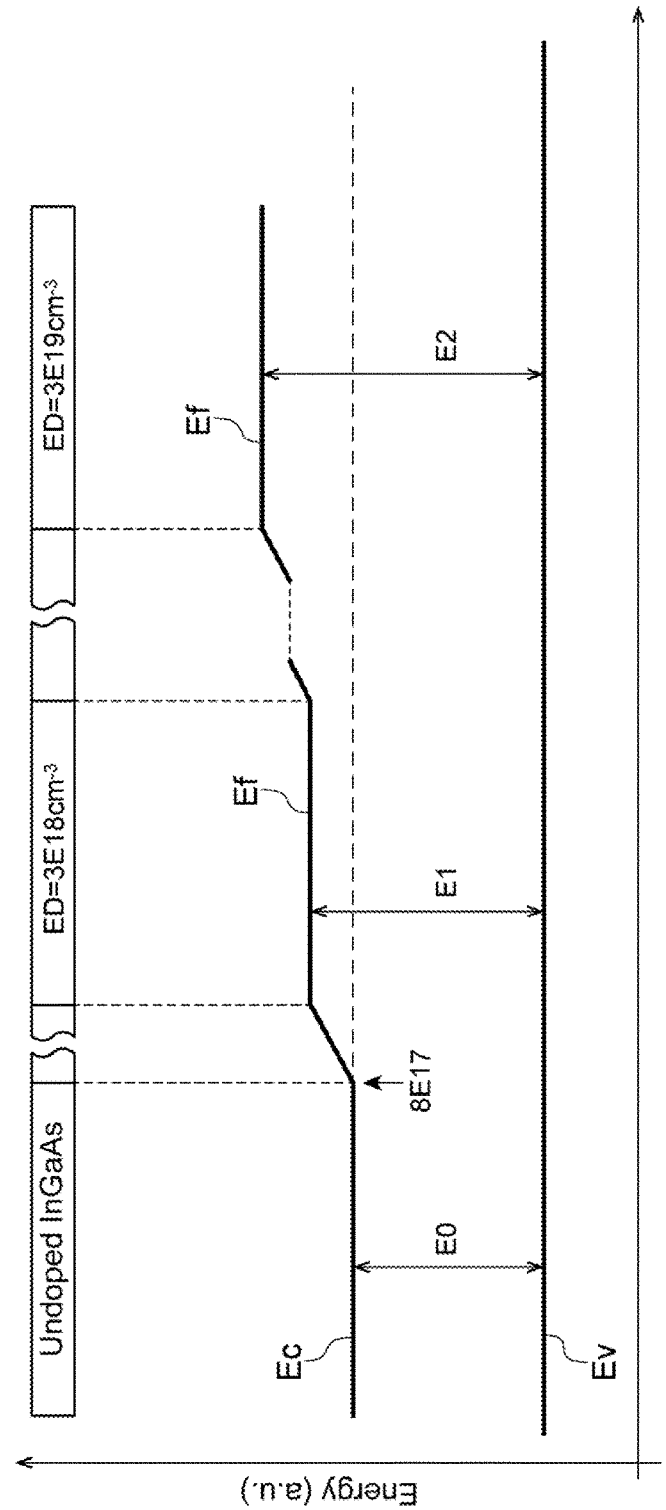

FIG. 8B
FIG. 8D
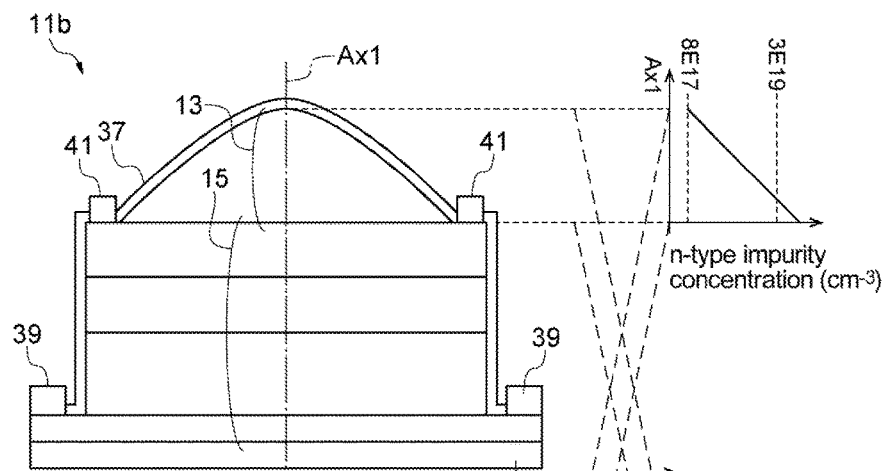
FIG. 8A
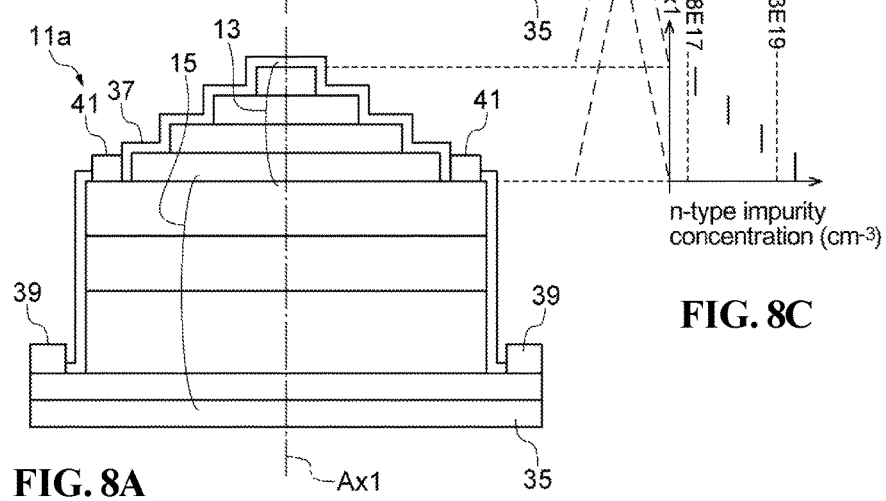
FIG. 8C

INFRARED LIGHT-RECEIVING DEVICE

BACKGROUND OF THE INVENTION

1. Field of the Invention

The present invention relates to an infrared light-receiving device.

2. Description of the Related Art

Non-Patent Document 1 (Baile Chen, Weiyang Jiang, Jinrong Yuan, Archie L. Holmes, Jr., and Bora. M. Onat, "SWIR/MWIR InP-Based p-i-n Photodiodes with InGaAs/GaAsSb Type-II Quantum Wells," IEEE JOURNAL OF QUANTUM ELECTRONICS, VOL. 47, NO. 9, September 2011) discloses photodiodes having a type-II quantum well structure.

SUMMARY OF THE INVENTION

A light-receiving device (photodiode) including an optical absorption layer having an InGaAs/GaAsSb type II superlattice structure has a sensitivity to light in the near-infrared wavelength region of 1.3 to 2.5 micrometers. However, the sensitivity characteristics of the light-receiving device may change depending on a wavelength of light. The wavelength dependence of the sensitivity narrows the range of applications. If differences in sensitivity between wavelengths are improved, the application range in which infrared light-receiving devices are applicable will be expanded.

An infrared light-receiving device according to an aspect of the present invention includes a substrate having a principal surface; an optical absorption layer disposed on the principal surface of the substrate, the optical absorption layer including a type-II superlattice structure; and an optical filter disposed on the optical absorption layer, the optical filter including an incident surface, the optical filter including a first semiconductor region disposed on the optical absorption layer, a second semiconductor region disposed on the first semiconductor region, and a third semiconductor region disposed on the second semiconductor region, each of the first, second, and third semiconductor regions including an n-type InGaAs layer. The first semiconductor region contains an n-type impurity with a concentration of $2.0 \times 10^{19}$ $cm^{-3}$ or more. The third semiconductor region contains an n-type impurity with a concentration of $3.0 \times 10^{18}$ $cm^{-3}$ or less and $8.0 \times 10^{17}$ $cm^{-3}$ or more. In addition, the second semiconductor region contains an n-type impurity with a concentration between the impurity concentration of the first semiconductor region and the impurity concentration of the second semiconductor region.

The above-described object and other objects, features, and advantages of the present invention will become apparent more easily in the detailed description of the preferred embodiments of the present invention which will be described below with reference to the accompanying drawings.

BRIEF DESCRIPTION OF THE DRAWINGS

FIGS. 2A, 2B, and 2C are graphical views illustrating the relationships between the n-type impurity concentration and the optical band gap in InGaAs.

FIGS. 8A, 8B, 8C, and 8D are diagrams showing shapes of optical filters and n-type impurity concentration profiles of the optical filters in infrared light-receiving devices according to Example 3.

DESCRIPTION OF THE PREFERRED EMBODIMENTS

Figure 1:
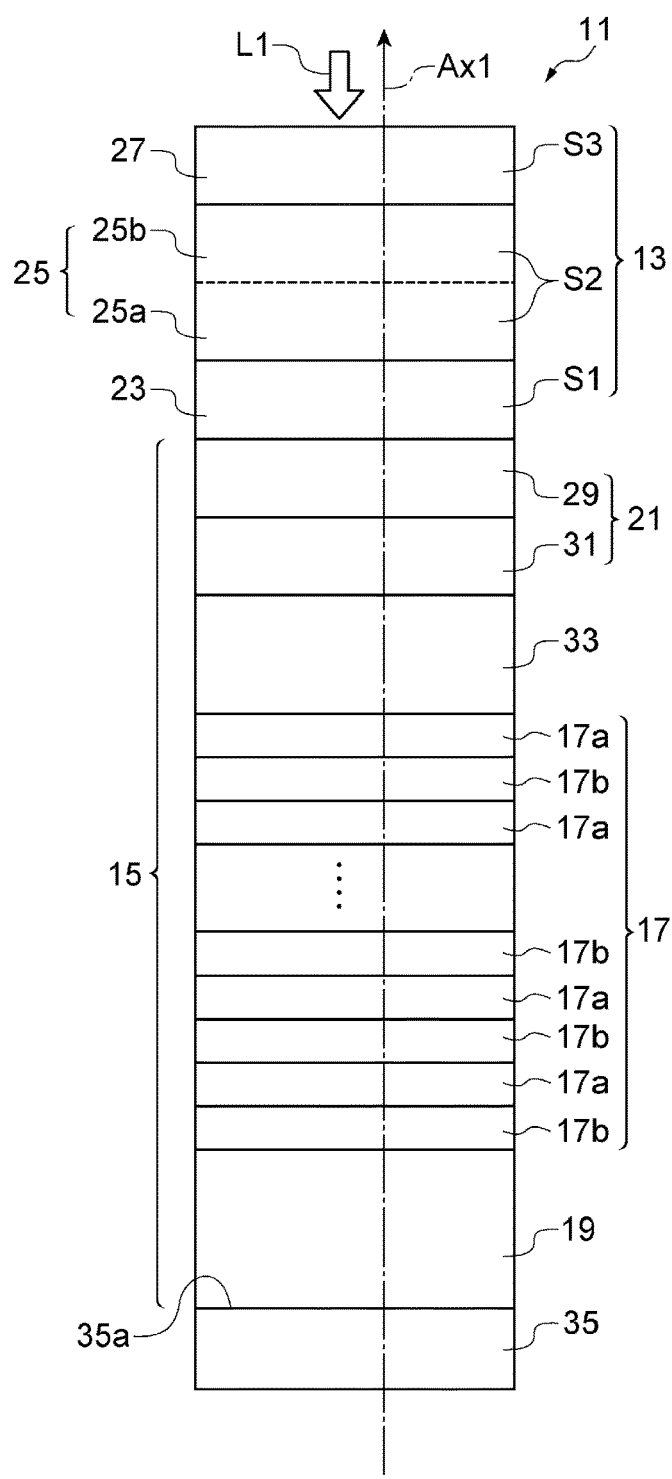
FIG. 1 is a view schematically showing a structure of semiconductor layers in an infrared light-receiving device according to the present embodiment.

Specific embodiments will be described below.

An infrared light-receiving device according to an embodiment includes (a) a substrate having a principal surface; (b) an optical absorption layer disposed on the principal surface of the substrate, the optical absorption layer including a type-II superlattice structure; and (c) an optical filter disposed on the optical absorption layer, the optical filter including an incident surface, the optical filter including a first semiconductor region disposed on the optical absorption layer, a second semiconductor region disposed on the first semiconductor region, and a third semiconductor region disposed on the second semiconductor region, each of the first, second, and third semiconductor regions including an n-type InGaAs layer. The first semiconductor region contains an n-type impurity with a concentration of $2.0 \times 10^{19}$ $cm^{-3}$ or more. The third semiconductor region contains an n-type impurity with a concentration of $3.0 \times 10^{18}$ $cm^{-3}$ or less and $8.0 \times 10^{17}$ $cm^{-3}$ or more. In addition, the second semiconductor region contains an n-type impurity with a concentration between the impurity concentration of the first semiconductor region and the impurity concentration of the second semiconductor region.

According to the infrared light-receiving device, InGaAs with an n-type impurity concentration of more than $8.0 \times 10^{17}$ $cm^{-3}$ (expressed as "8.0E17 $cm^{-3}$") exhibits an optical band gap energy that is larger than the band gap energy of InGaAs because of the Moss-Burstein effect. Consequently, light having an energy larger than the band gap energy of InGaAs and smaller than the optical band gap energy is absorbed by InGaAs doped with an n-type impurity having a low concentration of 8.0E17 $cm^{-3}$ or less and undoped InGaAs, but passes through InGaAs doped with an n-type impurity having a relatively high concentration of more than 8.0E17 $cm^{-3}$ so that the Moss-Burstein effect occurs. InGaAs with an n-type impurity concentration of more than 8.0E17 $cm^{-3}$ has an optical band gap energy according to its impurity concentration. The optical filter includes semiconductor regions having different n-type impurity concentrations in a concentration range of more than 8.0E17 cm$^{-3}$. These semiconductor regions have different optical band gap energies depending on their impurity concentrations. The optical response characteristics of the infrared light-receiving device may be compensated by the optical filter including the InGaAs layer with an n-type impurity concentration of more than 8.0E17 cm$^{-3}$. The amounts of light entering the optical absorption layer are changed depending on the optical absorption characteristics of the semiconductor regions in the optical filter. Consequently, the optical response characteristics of the infrared light-receiving device depend on optical absorption characteristics obtained by combining the optical response characteristics of the optical absorption layer with the optical absorption characteristics of the optical filter.

In the infrared light-receiving device according to an embodiment, preferably, the second semiconductor region of the optical filter has a first value of n-type impurity concentration at a boundary between the first semiconductor region and the second semiconductor region, and a second value of n-type impurity concentration at a boundary between the second semiconductor region and the third semiconductor region, the second value being lower than the first value. The second semiconductor region includes a portion in which the n-type impurity concentration profile of the optical filter changes monotonously from the first value to the second value in a direction from the first semiconductor region to the third semiconductor region.

In the infrared light-receiving device according to an embodiment, preferably, the first semiconductor region, the second semiconductor region, and the third semiconductor region of the optical filter have a first cross-sectional area, a second cross-sectional area, and a third cross-sectional area, respectively. The first cross-sectional area is larger than the second cross-sectional area. The second cross-sectional area is larger than the third cross-sectional area. In addition, the first cross-sectional area, the second cross-sectional area, and the third cross-sectional area are each determined on a plane parallel to the principal surface of the substrate.

According to the infrared light-receiving device, the third semiconductor region, which is doped with the lowest concentration and has the smallest cross-sectional area in the optical filter, absorbs light having a relatively long wavelength in the light-receiving wavelength range of the infrared light-receiving device. The second semiconductor region, which is medium-doped in the optical filter and has a cross-sectional area that is larger than that of the third semiconductor region, absorbs light having a relatively middle wavelength in the light-receiving wavelength range of the infrared light-receiving device. The first semiconductor region, which is doped with the highest concentration in the optical filter and has a cross-sectional area that is larger than that of the second semiconductor region, absorbs light having a relatively short wavelength in the light-receiving wavelength range of the infrared light-receiving device.

In the infrared light-receiving device according to an embodiment, the optical absorption layer may have an InGaAs/GaAsSb quantum well structure.

According to the infrared light-receiving device, optical response characteristics in the optical absorption layer having an InGaAs/GaAsSb quantum well structure may be adjusted.

The infrared light-receiving device according to an embodiment may further include a first conductivity type semiconductor layer disposed on the substrate, a second conductivity type semiconductor layer disposed on the first conductivity type semiconductor layer, a first electrode in contact with the first conductivity type semiconductor layer, and a second electrode in contact with the second conductivity type semiconductor layer. The optical absorption layer is provided between the first conductivity type semiconductor layer and the second conductivity type semiconductor layer. The optical filter is disposed on the second conductivity type semiconductor layer in contact with the second conductivity type semiconductor layer.

According to the infrared light-receiving device, the optical filter is not provided on the carrier propagation path. The optical filter is independent from electric characteristics of the photodiode structure including the optical absorption layer. In addition, the optical filter has an n-type impurity concentration profile to obtain desired optical absorption characteristics.

In the infrared light-receiving device according to an embodiment, the second conductivity type semiconductor layer may include a p-type layer made of InP that is in contact with the optical filter so as to form a p-n junction at a boundary between the second conductivity type semiconductor layer and the optical filter.

According to the infrared light-receiving device, the optical filter including the InGaAs layer containing an n-type impurity with a concentration of more than 8.0E17 cm$^{-3}$ is provided on the p-type InP having a wider band gap energy than that of InGaAs.

The findings of the present invention can be easily understood by considering the following detailed description with reference to the attached drawings shown as exemplification. Embodiments regarding an infrared light-receiving device will now be described with reference to the attached drawings. Where possible, the same components are designated by the same reference numerals.

FIG. 1 is a view schematically showing a structure of semiconductor layers in an infrared light-receiving device according to the present embodiment. FIGS. 2A, 2B, and 2C are graphical views illustrating the relationships between the n-type impurity concentration and the optical band gap energy of InGaAs doped with the n-type impurity. Here, the optical band gap energy is an apparent band gap energy provided from the measurement of an optical absorption edge.

An infrared light-receiving device 11 includes an optical filter 13 and a photodiode structure 15. The photodiode structure 15 includes an optical absorption layer 17. The optical absorption layer 17 has a type-II superlattice structure. The optical filter 13 is made of n-type InGaAs and has an n-type impurity concentration of more than 8.0E17 cm$^{-3}$. In the infrared light-receiving device 11, the optical absorption layer 17 is provided between a first conductivity type semiconductor layer 19 and a second conductivity type semiconductor layer 21. The optical filter 13 and the optical absorption layer 17 are arranged in that order in the direction of a first axis Ax1.

The optical filter 13 includes a first semiconductor region 23, a second semiconductor region 25, and a third semiconductor region 27. The first semiconductor region 23, the second semiconductor region 25, and the third semiconductor region 27 are arranged in that order in the direction of the first axis Ax1. The optical filter 13 is disposed on the second conductivity type semiconductor layer 21. The first semiconductor region 23 has an n-type impurity concentration of 2.0E19 cm$^{-3}$ or more. The third semiconductor region 27 has an n-type impurity concentration of 3.0E18 cm$^{-3}$ or less. The second semiconductor region 25 has a first value of n-type impurity concentration (e.g., less than 2.0E19 cm$^{-3}$) at the boundary between the first semiconductor region 23 and the second semiconductor region 25 and has a second value of n-type impurity concentration (e.g., more than $3.0E18$ cm$^{-3}$) at the boundary between the second semiconductor region 25 and the third semiconductor region 27. The first value is higher than the second value. The second semiconductor region 25 includes a portion in which the n-type impurity concentration profile of the optical filter 13 changes monotonously from the first value to the second value in a direction from the first semiconductor region 23 to the third semiconductor region 27. Furthermore, in the second semiconductor region 25, the n-type impurity concentration profile of the optical filter 13 may decrease monotonously in a direction from the optical absorption layer 17 to the optical filter 13. Furthermore, the first semiconductor region 23 has an n-type impurity concentration of $2.0E19$ cm$^{-3}$ or more at the boundary between the first semiconductor region 23 and the second semiconductor region 25. The third semiconductor region 27 has an n-type impurity concentration of $3.0E18$ cm$^{-3}$ or less at the boundary between the second semiconductor region 25 and the third semiconductor region 27. The second semiconductor region 25 has a portion in which the n-type impurity concentration profile of the optical filter 13, in a range of $3.0E18$ cm$^{-3}$ to $2.0E19$ cm$^{-3}$, changes monotonously in a direction from the first semiconductor region 23 to the third semiconductor region 27, and the n-type impurity concentration profile of the optical filter 13 may decrease monotonously in a direction from the optical absorption layer 17 to the optical filter 13.

InGaAs having an n-type impurity concentration ND of more than $8.0E17$ cm$^{-3}$ exhibits an optical band gap energy that is larger than the band gap energy E0 of InGaAs because of the Moss-Burstein effect. Furthermore, InGaAs doped with an n-type impurity has optical absorption characteristics according to its n-type impurity concentration ND. Light having an energy larger than the band gap energy E0 of InGaAs and smaller than the optical band gap energy is absorbed by InGaAs doped with an n-type impurity having a low concentration ($8.0E17$ cm$^{-3}$ or less) and undoped InGaAs, but passes through InGaAs which is doped with an n-type impurity having a relatively high concentration so that the Moss-Burstein effect occurs. Here, photon energy E is related to the wavelength ($\lambda$) of light and represented by the expression $E = h \times c / \lambda$, where h is the Planck constant, and c is the speed of light in vacuum. InGaAs having an n-type impurity concentration ND of more than $8.0E17$ cm$^{-3}$ has an optical band gap energy based on the Moss-Burstein effect according to its impurity concentration. The optical filter 13 includes the semiconductor regions (23, 25 and 27) having different n-type impurity concentrations ND in a concentration range of more than $8.0E17$ cm$^{-3}$. According to the infrared light-receiving device 11, the amounts of light entering the optical absorption layer 17 are changed depending on the optical absorption characteristics of the semiconductor regions (23, 25, and 27) in the optical filter 13. The optical response characteristics of the infrared light-receiving device 11 depend not on optical absorption characteristics of the optical absorption layer 17 itself, but on optical absorption characteristics obtained by combining the optical absorption characteristics of the optical absorption layer 17 with the optical absorption characteristics of the optical filter 13. Consequently, the optical response characteristics of the infrared light-receiving device 11 may be adjusted by InGaAs having an n-type impurity concentration of more than $8.0E17$ cm$^{-3}$ in the optical filter 13.

With reference to FIGS. 2A, 2B, and 2C, the Moss-Burstein effect in InGaAs containing an n-type impurity will be described. FIG. 2A shows the conduction band and valence band of undoped In$_x$Ga$_{1-x}$As. The difference in energy between the conduction band and the valence band of undoped In$_{1x}$Ga$_{1-x}$As is equivalent to a photon energy of 0.728 eV (the value when the composition X of In is equal to 0.53, lattice-matched to InP) and corresponds to a wavelength of about 1.7 micrometers. FIG. 2B shows the conduction band Ec, valence band Ev, and Fermi surface Ef of InGaAs with an n-type impurity concentration of more than $8.0E17$ cm$^{-3}$, for example, an n-type impurity concentration ND of $3.0E18$ cm$^{-3}$. The difference in energy between the Fermi surface Ef in the conduction band Ec and the valence band Ev of this InGaAs is larger by 0.048 eV than the band gap energy (0.728 eV) of GaInAs. The reason for this is that the Fermi level is shifted from the inside of the band gap into the inside of the conduction band Ec by the addition of an n-type impurity with a concentration of $3.0E18$ cm$^{-3}$. An electron excited from the valence band Ev requires transition energy E1 to reach the Fermi surface Ef in the conduction band Ec from the valence band Ev. FIG. 2C shows the conduction band Ec and valence band Ev of InGaAs with an n-type impurity concentration ND of more than $8.0E17$ cm$^{-3}$, for example, an n-type impurity concentration of $3.0E19$ cm$^{-3}$. The difference in energy between the Fermi surface Ef in the conduction band Ec and the valence band Ev of this InGaAs is larger by 0.281 eV than the band gap energy (0.728 eV) of GaInAs. The reason for this is that the Fermi level is shifted from the inside of the band gap into the inside of the conduction band Ec by the addition of an n-type impurity with a concentration of $3.0E19$ cm$^{-3}$. An electron excited from the valence band Ev requires transition energy E2 to reach the Fermi surface Ef in the conduction band Ec from the valence band Ev.

As is understood from the above-description, in the InGaAs containing an n-type impurity with a concentration of more than $8.0E17$ cm$^{-3}$, the photon energy required for the optical transition of an electron increases with the increasing n-type impurity concentration.

As shown in FIG. 1, the first semiconductor region 23, the second semiconductor region 25, and the third semiconductor region 27 of the optical filter 13 are arranged in that order in a direction from the optical absorption layer 17 to the optical filter 13. The first semiconductor region 23, the second semiconductor region 25, and the third semiconductor region 27 have a first cross-sectional area S1, a second cross-sectional area S2, and a third cross-sectional area S3, respectively. The first cross-sectional area S1 is larger than the second cross-sectional area S2. Furthermore, the second cross-sectional area S2 is larger than the third cross-sectional area S3. The first cross-sectional area S1, the second cross-sectional area S2, and the third cross-sectional area S3 are each determined on a plane that intersects the first axis Ax1.

According to the infrared light-receiving device 11, the third semiconductor region 27, which is doped with the lowest concentration and has a small third cross-sectional area S3 in the optical filter 13, absorbs light having a relatively long wavelength in the light-receiving wavelength range of the infrared light-receiving device 11. The second semiconductor region 25, which is medium-doped in the optical filter and has a cross-sectional area S2 that is larger than that of the third semiconductor region 27, absorbs light having a relatively middle wavelength in the light-receiving wavelength range of the infrared light-receiving device 11. The first semiconductor region 23, which is doped with the highest concentration in the optical filter 13 and has a cross-sectional area S1 that is larger than that of the second semiconductor region 25, absorbs light having a relatively short wavelength in the light-receiving wavelength range of the infrared light-receiving device 11.

Examples of relative cross-sectional areas of the semiconductor regions are shown below:
    First semiconductor region 23: S1=16
    Second lower semiconductor region 25a: S2U (S2)=9
    Second upper semiconductor region 25b: S2D (S2)=4
    Third semiconductor region 27: S3=1

The optical absorption layer 17 consists of a type-II superlattice structure including first semiconductor layers 17a and second semiconductor layers 17b. The first semiconductor layers 17a and the second semiconductor layers 17b are alternately arranged in the direction of the first axis Ax1. The first semiconductor layers 17a are, for example, composed of undoped InGaAs. The second semiconductor layers 17b are, for example, composed of GaAsSb.

A plurality of InGaAs regions (23, 25a, 25b, and 27) having different n-type impurity concentrations may correct the wavelength dependence of optical response characteristics of the optical absorption layer 17 including the type-II superlattice structure having optical responsivity in the infrared wavelength region and may provide desired optical response characteristics to the infrared light-receiving device 11.

Examples of structures of semiconductor layers in the infrared light-receiving device 11 are shown below:
    Optical filter 13: InGaAs with an n-type impurity concentration of more than $8.0E17$ $cm^{-3}$
    First semiconductor region 23: Si-doped InGaAs containing an n-type impurity concentration of $2.0E19$ $cm^{-3}$ or more, thickness 1,000 to 2,000 nm
    Second semiconductor region 25: Si-doped InGaAs containing an n-type impurity concentration of $3.0E18$ to $2.0E19$ $cm^{-3}$, thickness 1,000 to 4,000 nm
    Third semiconductor region 27: Si-doped InGaAs containing an n-type impurity concentration of $3.0E18$ $cm^{-3}$ or less, thickness 1,000 to 2,000 nm
    Photodiode structure 15: III-V compound semiconductor region with an n-type impurity concentration of $8.0E17$ $cm^{-3}$ or less
    First conductivity type semiconductor layer 19: Si-doped InGaAs (ND=$1E18$ $cm^{-3}$), thickness 100 nm
    Second conductivity type semiconductor layer 21: including p-type contact layer 29 and p-type anode layer 31
    P-type contact layer 29: Zn-doped InP, thickness 800 nm
    P-type anode layer 31: Zn-doped InGaAs, thickness 125 nm
    Semiconductor layer 33: undoped InGaAs, thickness 800 nm
    Optical absorption layer 17: InGaAs/GaAsSb quantum well structure, repeated 50 to 400 times, thickness 500 to 4,000 nm
    Substrate 35: InP The p-type anode layer 31, for example, smoothly connects a band structure including the p-type contact layer 29 and the semiconductor layer 33. The semiconductor layer 33, for example, serves as a layer capable of generating photocarriers. The p-type contact layer 29 comes into contact with the optical filter 13 to form a p-n junction at a boundary between the p-type contact layer 29 in the second conductivity type semiconductor layer 2l and the optical filter 13. These semiconductor layers are grown on a principal surface 35a of the substrate 35 by a molecular beam epitaxy method or metal-organic vapor phase epitaxy method. In the embodiment, the first axis Ax1 extends in a direction intersecting the principal surface 35a of the substrate 35 from the optical absorption layer 17 to the optical filter 13.

Figure 3B:
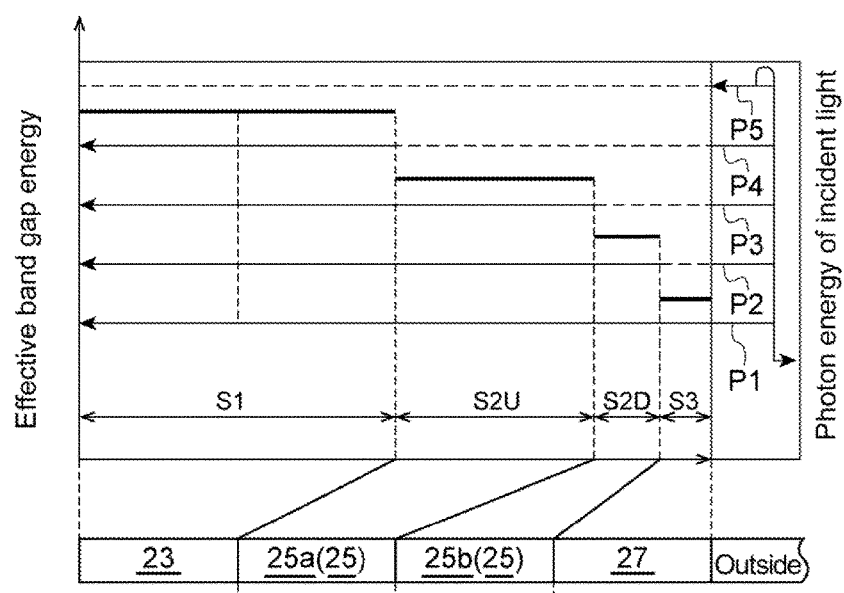
FIGS. 3A and 3B are graphical views showing an example of an optical filter in an infrared light-receiving device according to the present embodiment.
Figure 3A:
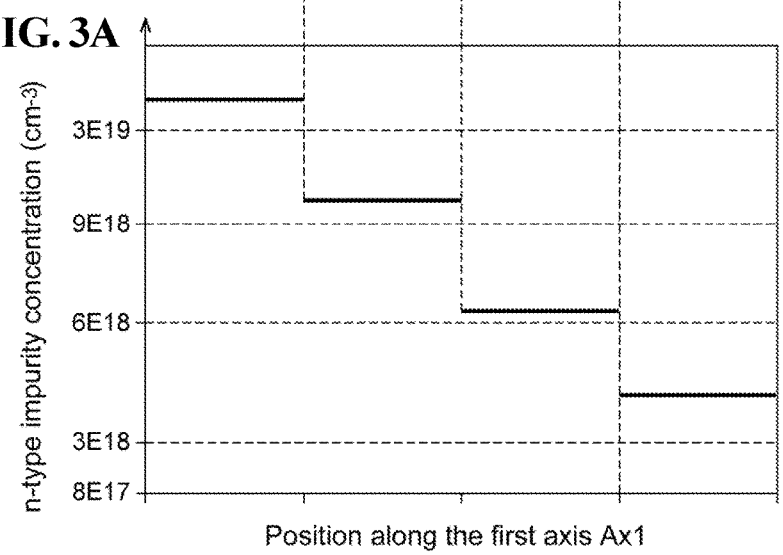

FIGS. 3A and 3B are graphical views showing an example of an optical filter in an infrared light-receiving device according to the present embodiment. An optical filter 13 shown in FIG. 3A includes four semiconductor regions (23, 25a, 25b, and 27) with the n-type impurity concentration ($cm^{-3}$) shown below:
    First semiconductor region 23: 3E19
    Second lower semiconductor region 25a: 9E18
    Second upper semiconductor region 25b: 6E18
    Third semiconductor region 27: 3E18

These semiconductor regions (23, 25a, 25b, and 27) are arranged such that the n-type impurity concentration changes monotonously in a direction from the optical absorption layer 17 to the optical filter 13. The first semiconductor region 23 having the highest impurity concentration is provided on the optical absorption layer 17. The second lower semiconductor region 25a having a lower impurity concentration than that of the first semiconductor region 23 is provided on the first semiconductor region 23. The second upper semiconductor region 25b having a lower impurity concentration than that of the second lower semiconductor region 25a is provided on the second lower semiconductor region 25a. The third semiconductor region 27 having a lower impurity concentration than that of the second upper semiconductor region 25b is provided on the second upper semiconductor region 25b.

FIG. 3B shows the effective band gap energies of InGaAs in the semiconductor regions (23, 25a, 25b, and 27). The first semiconductor region 23, the second lower semiconductor region 25a, the second upper semiconductor region 25b, and the third semiconductor region 27 are stacked in that order on the optical absorption layer 17 in a direction from the optical absorption layer 17 to the optical filter 13. Furthermore, the InGaAs layer in the first semiconductor region 23 has the largest optical band gap energy. The optical band gap energy decreases in the order from the first semiconductor region 23, the second lower semiconductor region 25a, the second upper semiconductor region 25b to the third semiconductor region 27. The InGaAs layer in the third semiconductor region 27 has the smallest optical band gap energy. The graphical view shows typical lights (P1, P2, P3, P4, and P5) with five different wavelengths. The wavelength of light decreases in the order from a first light P1 (light with the longest wavelength), a second light P2, a third light P3, a fourth light P4 to a fifth light P5 (light with the shortest wavelength). The first light P1 may pass through the semiconductor regions (23, 25a, 25b, and 27). The second light P2 may pass through the semiconductor regions (23, 25a, and 25b), but is absorbed by the semiconductor region (27). The third light P3 may pass through the semiconductor regions (23 and 25a), but is absorbed by the semiconductor regions (25b and 27). The fourth light P4 may pass through the semiconductor region (23), but is absorbed by the semiconductor regions (25a, 25b, and 27). The fifth light P5 is absorbed by the semiconductor regions (23, 25a, 25b, and 27). In the optical filter 13, the semiconductor regions (23, 25a, 25b, and 27) having different concentrations are arranged in decreasing order of n-type impurity concentration in a direction from the optical absorption layer 17 to the optical filter 13. In the optical filter 13, the semiconductor regions (23, 25a, 25b, and 27) are arranged such that the cross-sectional area (which is determined on a plane parallel to the principal surface of the substrate) decreases with decreasing n-type impurity concentration. According to this arrangement, the semiconductor region (27) having the lowest n-type impurity concentration is located on the top, and the semiconductor region (23) having the highest n-type impurity concentration is located on the bottom.

The first light P1 passes through the first semiconductor region 23, the second lower semiconductor region 25a, the second upper semiconductor region 25b, and the third semiconductor region 27. The second light P2 first enters the second upper semiconductor region 25b outside the third semiconductor region 27. The third light P3 first enters the second lower semiconductor region 25a outside the third semiconductor region 27 and the second upper semiconductor region 25b. The fourth light P4 first enters the first semiconductor region 23 outside the third semiconductor region 27, the second upper semiconductor region 25b, and the second lower semiconductor region 25a. The fifth light P5 cannot pass through the first semiconductor region 23, the second lower semiconductor region 25a, the second upper semiconductor region 25b, and the third semiconductor region 27.

The transmission amount of light (P1 to P5, denoted by reference sign "L1" in FIG. 1) incident on the incident surface of the infrared light-receiving device 11 is changed according to the cross-sectional area ratios of the semiconductor regions (23, 25a, 25b, and 27).

Example 1

Figure 4:
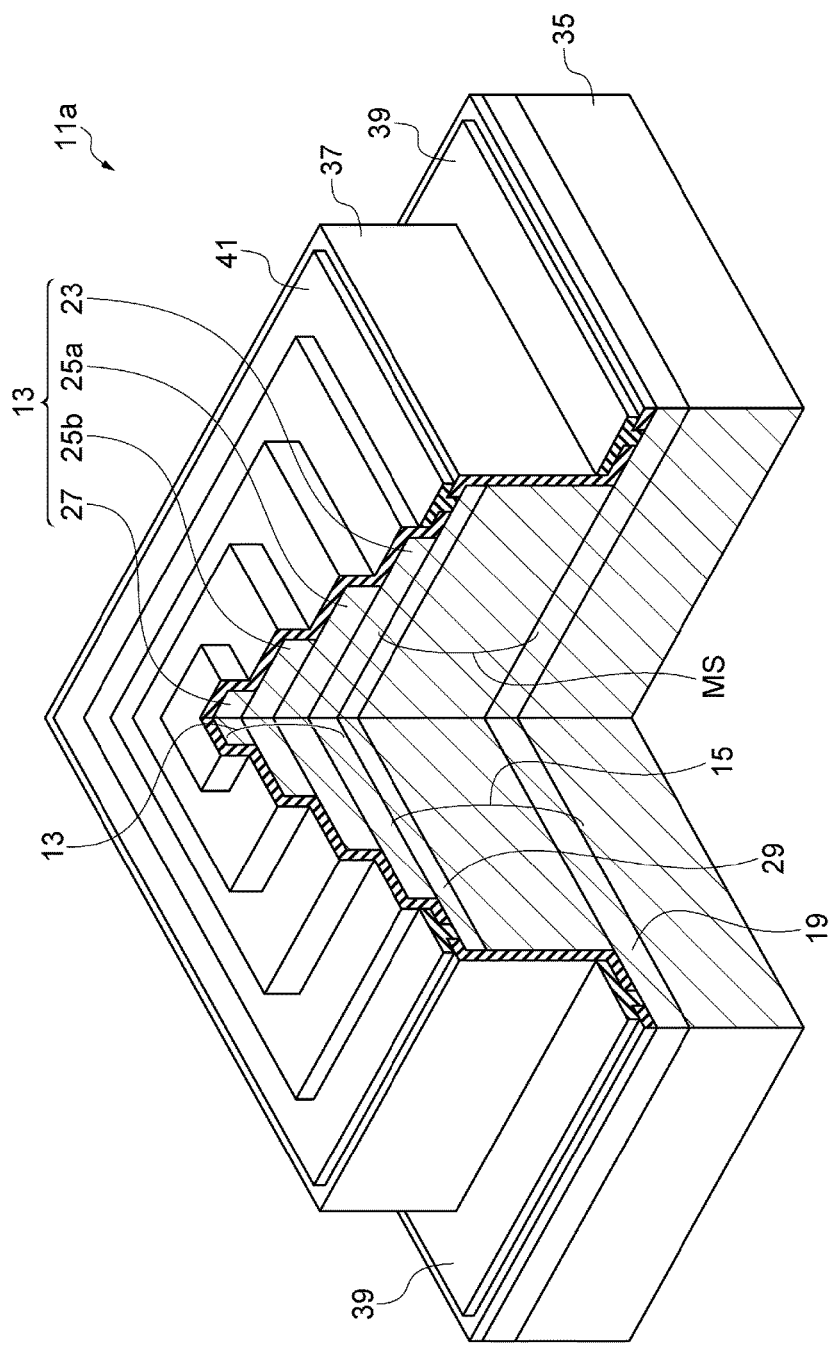
FIG. 4 is a partially broken view schematically showing an infrared light-receiving device according to an example.

FIG. 4 is a partially broken view schematically showing an infrared light-receiving device according to an example. An infrared light-receiving device 11a includes a substrate 35, a photodiode structure 15 provided on the substrate 35, and an optical filter 13 provided on the photodiode structure 15. The infrared light-receiving device 11a includes a passivation film 37 which covers the optical filter 13 and the photodiode structure 15, and a first electrode 39 and a second electrode 41 provided on the photodiode structure 15. The photodiode structure 15 has a mesa structure MS. The mesa structure MS includes an optical absorption layer 17. An upper surface of the mesa structure MS determines an incident cross-sectional area of light into the optical absorption layer 17. The optical filter 13 is in contact with the upper surface of the photodiode structure 15. Specifically, the first electrode 39 is in contact with a first conductivity type semiconductor layer 19, and the second electrode 41 is in contact with a second conductivity type semiconductor layer 21 (29). The optical filter 13 is in contact with the second conductivity type semiconductor layer 21. The mesa structure MS is formed by using a photolithography method and an etching method. Furthermore, the passivation film 37 includes a silicon-based inorganic insulating film, such as silicon oxide, formed by a chemical vapor deposition method. Furthermore, the silicon-based inorganic insulating film is formed by patterning using photolithography and etching methods. The first electrode 39 and the second electrode 41 are composed of AuTi/AuZnAu (P-electrode) and Au—Ge—Ni (N-electrode), respectively.

Specifically, the second conductivity type semiconductor layer 21 includes a p-type contact layer 29 made of p-type InP. InP has a larger band gap energy than the band gap energy of InGaAs in the optical filter 13 and the band gap energy of the InGaAs/GaAsSb quantum well structure in the optical absorption layer 17. The optical filter 13 including n-type InGaAs containing an n-type impurity with a concentration of more than $8.0E17$ $cm^{-3}$ is provided on the p-type InP contact layer 29. According to the infrared light-receiving device 11a, the optical absorption layer 17 generates photocarriers in response to incident light. The photocarriers from the optical absorption layer 17 are not propagated in the optical filter 13. The optical filter 13 is independent from the electric characteristics of the photodiode structure 15 and has an n-type impurity concentration profile for optical absorption characteristics.

Figure 5:
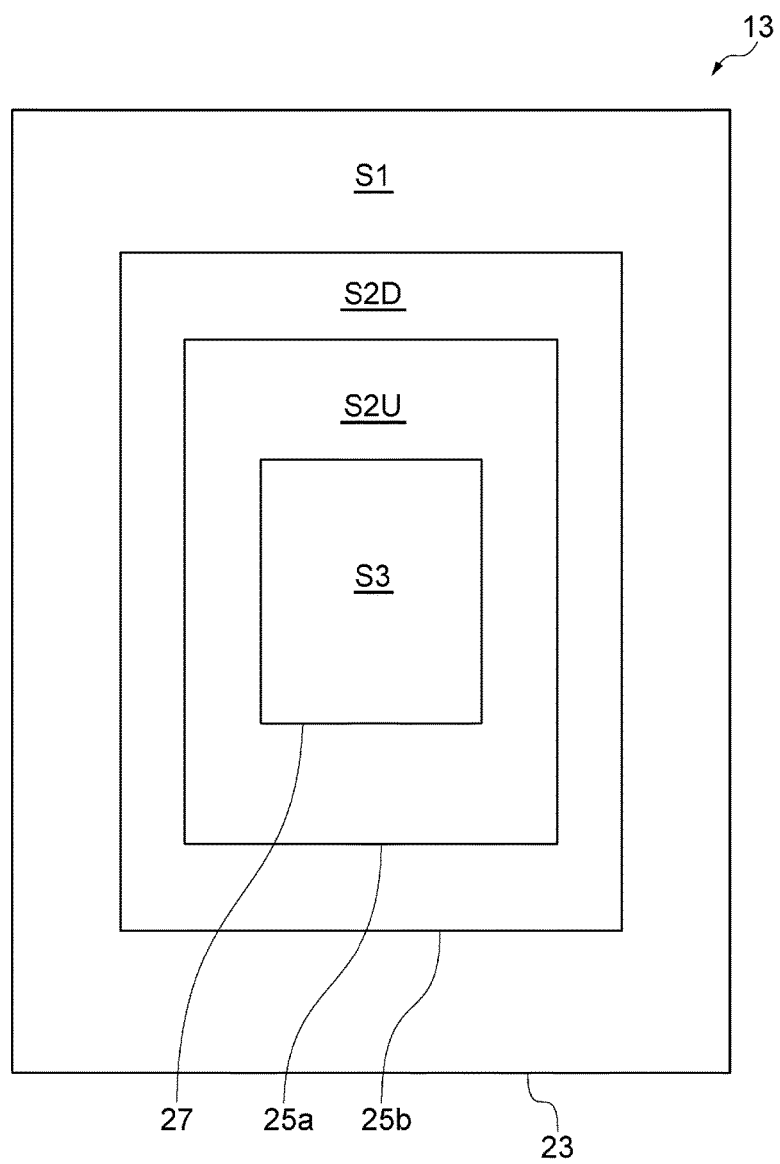
FIG. 5 is a plan view showing an optical filter of an infrared light-receiving device according to Example 1.

FIG. 5 is a plan view showing an optical filter of an infrared light-receiving device according to Example 1. The cross-sectional areas (S1, S2D, S2U, and S3) of the semiconductor regions (23, 25a, 25b, and 27) are rectangular or square. For example, the cross-sectional areas (S1, S2D, S2U, and S3) of the semiconductor regions (23, 25a, 25b, and 27) are square with a side length (m) shown below:
  First semiconductor region 23 (S1): 18E-6
  Second lower semiconductor region 25a (S2D): 13.5E-6
  Second upper semiconductor region 25b (S2U): 9.0E-6
  Third semiconductor region 27 (S3): 4.5E-6

Figure 6:
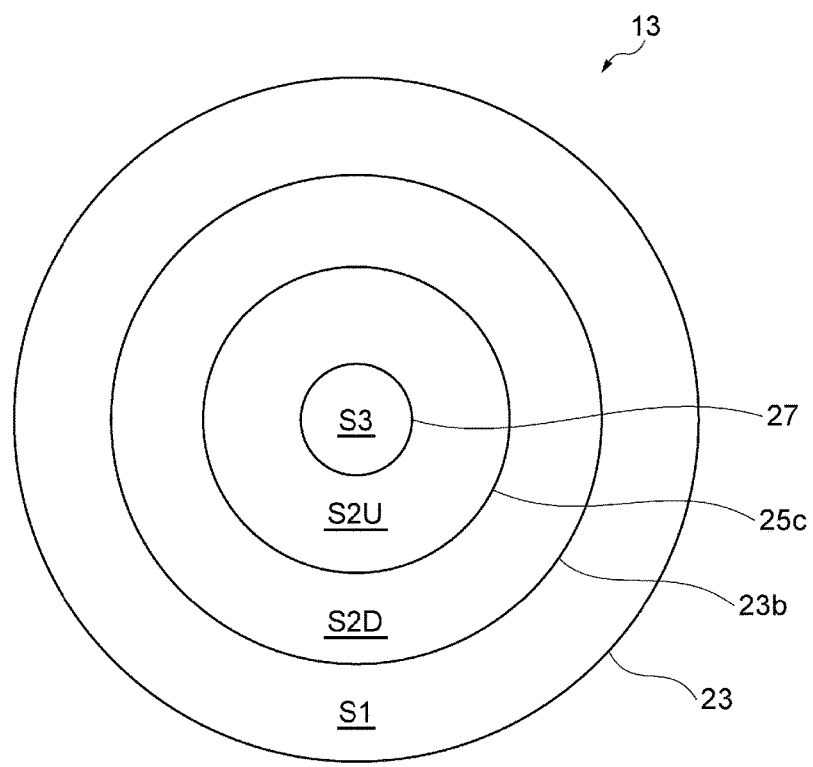
FIG. 6 is a plan view showing another optical filter of an infrared light-receiving device according to Example 1.

FIG. 6 is a plan view showing another optical filter of an infrared light-receiving device according to Example 1. The cross-sectional areas (S1, S2D, S2U, and S3) of the semiconductor regions (23, 25a, 25b, and 27) are circular or elliptic. For example, the cross-sectional areas (S1, S2D, S2U, and S3) of the semiconductor regions (23, 25a, 25b, and 27) are a circle with a radius (m) shown below:
  First semiconductor region 23 (S1): 9E-6
  Second lower semiconductor region 25a (S2D): 6.75E-6
  Second upper semiconductor region 25b (S2U): 4.5E-6
  Third semiconductor region 27 (S3): 2.25E-6

As is understood from the above-description with reference to FIGS. 1 to 6, the cross-sectional area is not limited to a specific shape, such as a rectangular, square, circular, or elliptic shape exemplified above, but may have various shapes, such as a triangle and an n-polygon (where n is a natural number equal to or greater than 5). The semiconductor regions (23, 25a, 25b, and 27) having a desired cross-sectional shape have cross-sectional area ratios to one another such that desired optical response characteristics may be provided to the infrared light-receiving device according to Example 1. The cross-sectional areas are determined in consideration of changes in optical band gap energy due to the Moss-Burstein effect.

Example 2

Figure 7:
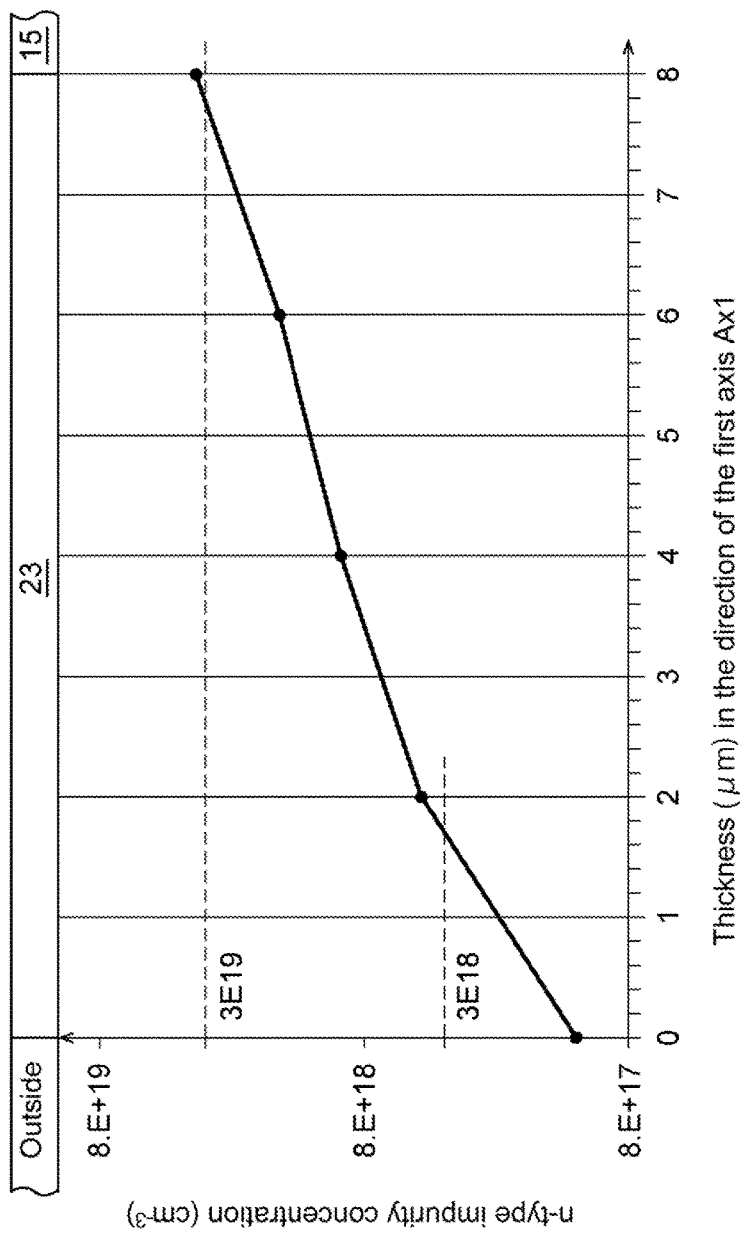
FIG. 7 is a graph showing an n-type impurity concentration profile of another optical filter of an infrared light-receiving device according to Example 2.

FIG. 7 is a graph showing an n-type impurity concentration profile of another optical filter of an infrared light-receiving device according to Example 2. The n-type impurity concentration profile of the optical filter 13 is not limited to a stepped profile, and may be an inclined profile that changes monotonously in a direction of the first axis Ax1. Alternatively, the n-type impurity concentration of the optical filter 13 may have a profile in which a stepped profile is combined with an inclined profile.

Example 3

FIGS. 8A, 8B, 8C, and 8D are diagrams showing shapes of optical filters and n-type impurity concentration profiles of the optical filters in infrared light-receiving devices according to Example 3.

FIG. 8A shows an infrared light-receiving device 11a. An optical filter 13 of the infrared light-receiving device 11a has a stepped appearance. The stepped shape of the optical filter 13 is formed by repeating photolithography and etching processes. Furthermore, the optical filter 13 of the infrared light-receiving device 11a has a stepped n-type impurity concentration profile shown in FIG. 8C and, alternatively, may have an inclined n-type impurity concentration profile shown in FIG. 8D.

FIG. 8B shows an infrared light-receiving device 11b. An optical filter 13 of the infrared light-receiving device 11b has a convex appearance. The convex shape of the optical filter 13, for example, may be formed by the method described below. First, a thick resist with a pattern which determines the outer edge of the optical filter 13 is disposed on a doped semiconductor layer. Then, the thick resist is deformed by a heat treatment. By etching the doped semiconductor layer using the deformed resist as an etching mask, the pattern of the thick resist is transferred to the doped semiconductor layer, thus forming a convex shape of the optical filter 13 from the doped semiconductor layer. The optical filter 13 of the infrared light-receiving device 11b has an inclined n-type impurity concentration profile shown in FIG. 8D and, alternatively, may have a stepped n-type impurity concentration profile shown in FIG. 8C.

Example 4

Figure 9A:
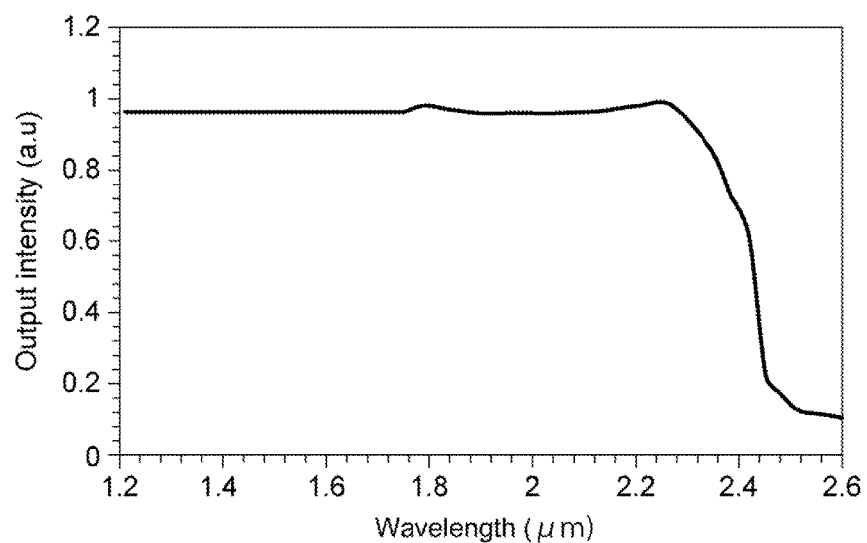
FIGS. 9A and 9B are graphs showing optical response characteristics compensated by an optical filter according to the present embodiment.
Figure 9B:
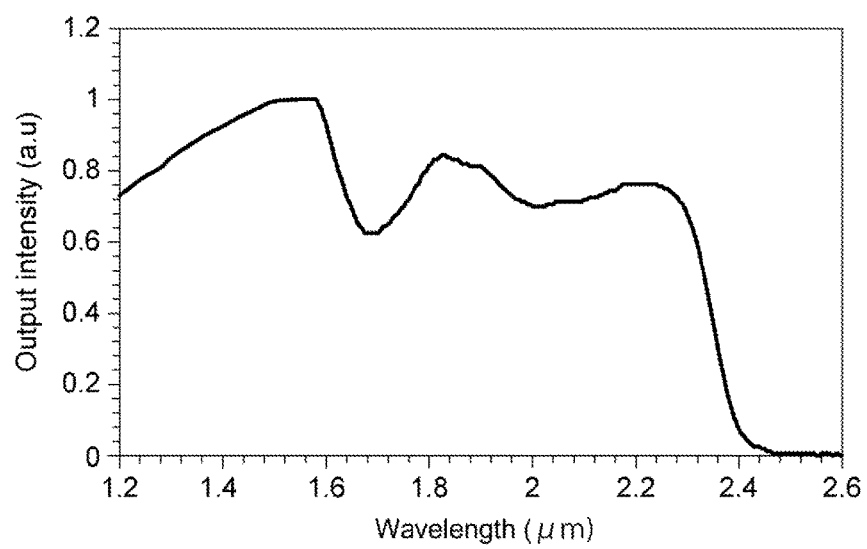
Figure 10:
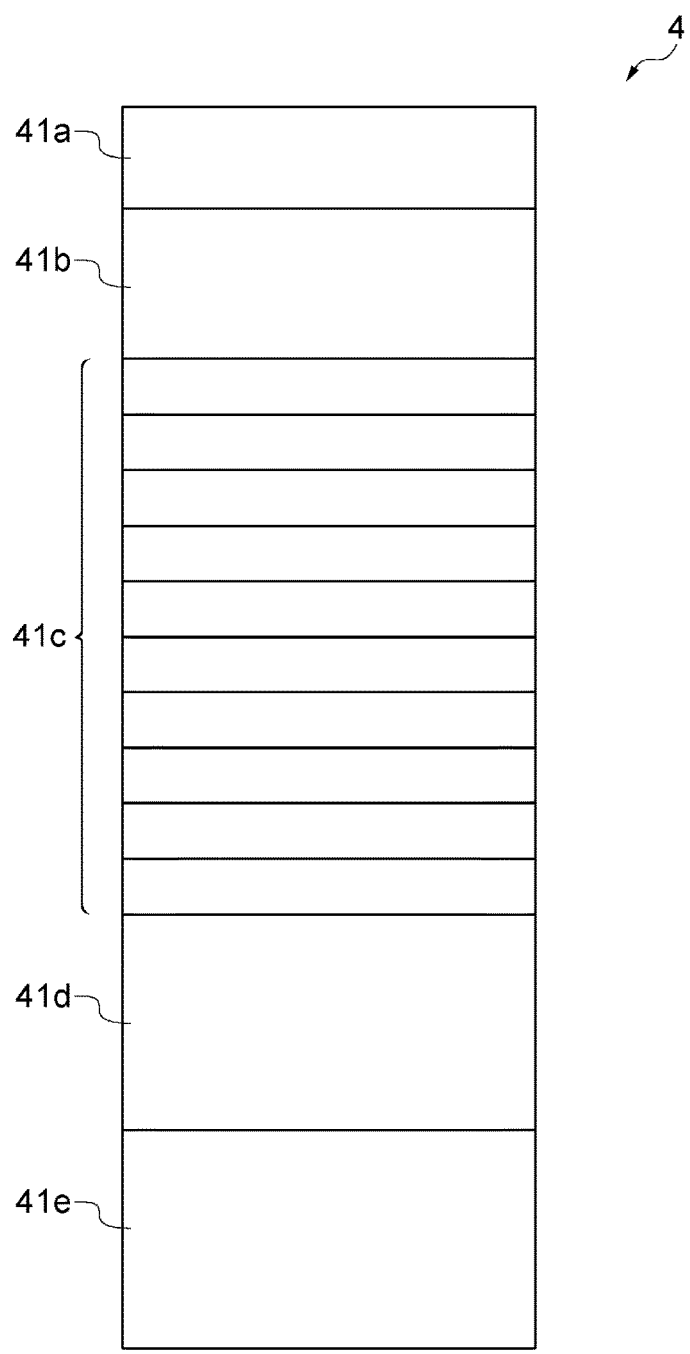
FIG. 10 is a view schematically showing a structure of semiconductor layers in an infrared light-receiving device having optical response characteristics without an optical filter.

FIGS. 9A and 9B are graphs showing optical response characteristics compensated by an optical filter according to the present embodiment. FIG. 10 is a view schematically showing a structure of semiconductor layers in an infrared light-receiving device having optical response characteristics of the optical absorption layer without an optical filter. Specifically, FIG. 9A shows optical response characteristics compensated by an optical filter according to the present embodiment. FIG. 9B shows optical response characteristics (optical response characteristics not compensated by an optical filter) of a photodiode structure 4 shown in FIG. 10.

A detailed structure of the III-V compound semiconductor region of the photodiode structure 4 shown in FIG. 10 is shown below:
  P-type contact layer 41a: Zn-doped InP, thickness 500 nm
  Semiconductor layer 41b: undoped InGaAs, thickness 500 nm
  Optical absorption layer 41c: Type-II InGaAs/GaAsSb quantum well structure (superlattice structure), repeated 200 times, thickness 1,000 nm
  N-type contact layer 41d: Si-doped InGaAs (ND=1E17 cm$^{-3}$), thickness 500 nm
  N-type semiconductor layer 41e: Si-doped InP (ND=1E18 cm$^{-3}$)

A structure (semiconductor region, thickness, and n-type impurity concentration) of a specific example of the optical filter capable of providing the optical response characteristics shown in FIG. 9A is shown below:
  First semiconductor region 23: 2,000 nm, 9E18 to 3E19 cm$^{-3}$
  Second lower semiconductor region 25a: 2,000 nm, 6E18 to 9E18 cm$^{-3}$
  Second upper semiconductor region 25b: 2,000 nm, 3E18 to 6E18 cm$^{-3}$
  Third semiconductor region 27: 2,000 nm, 8E17 to 3E18 cm$^{-3}$ For example, the impurity concentration at which light with a wavelength of 1.6 micrometers or less may be absorbed is 9.4E17 cm$^{-3}$ or more.

As shown in FIG. 9A, in the wavelength range of 1.2 to 2.35 micrometers, the difference in optical response characteristics is within a range of ±10%, and the infrared light-receiving device according to this example shows flat optical response characteristics.

Figure 11:
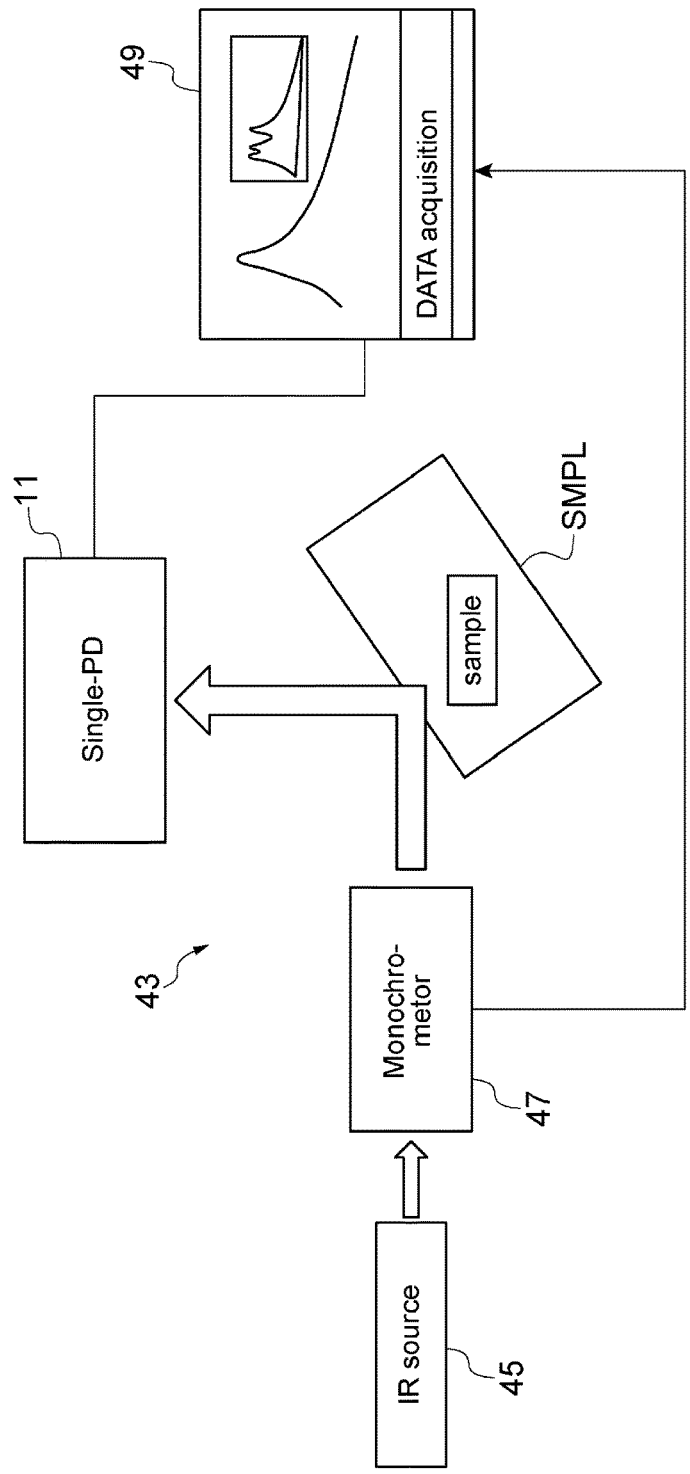
FIG. 11 is a schematic diagram showing a measurement system provided with an infrared light-receiving device according to the present embodiment.

FIG. 11 is a schematic diagram showing a measurement system provided with an infrared light-receiving device according to the present embodiment. In a measurement system 43, light having a wavelength range of 1.2 to 2.35 micrometers emitted from an infrared light source 45 is monochromatized with a monochromator 47 and radiated to a measuring object SMPL. An infrared light-receiving device 11 receives reflected light from the measuring object SMPL. The wavelength of light from the infrared light source 45 is scanned with the monochromator 47 and reflected light from the measuring object SMPL is received by the infrared light-receiving device 11 (11a, 11b) in synchronism with scanning. Measurement data from the infrared light-receiving device 11 (11a, 11b) is sent to a processing unit 49. According to the measurement system 43, in the infrared reflection spectrum of the measuring object SMPL, the effect due to differences in optical response characteristics in the infrared light-receiving device 11 (11a, 11b) may be reduced.

Having illustrated and described the principles of the present invention in a preferred embodiment, it is appreciated by persons skilled in the art that the present invention can be modified in arrangement and detail without departing from such principles. The present invention is not limited to the specific structures disclosed in the embodiment. We therefore claim all modifications and variations coming within the spirit and scope of the following claims.

What is claimed is:
1. An infrared light-receiving device comprising:
  a substrate having a principal surface;
  an optical absorption layer disposed on the principal surface of the substrate, the optical absorption layer including a type-II superlattice structure; and
  an optical filter disposed on the optical absorption layer, the optical filter including an incident surface, the optical filter including a first semiconductor region disposed on the optical absorption layer, a second semiconductor region disposed on the first semiconductor region, and a third semiconductor region disposed on the second semiconductor region, each of the first, second, and third semiconductor regions including an n-type InGaAs layer, wherein
  the first semiconductor region has an n-type impurity concentration of $2.0 \times 10^{19}$ cm$^{-3}$ or more,
  the third semiconductor region has an n-type impurity concentration of $3.0 \times 10^{18}$ cm$^{-3}$ or less and $8.0 \times 10^{17}$ cm$^{-3}$ or more, and
  the second semiconductor region has an n-type impurity concentration between the n-type impurity concentration of the first semiconductor region and the n-type impurity concentration of the third semiconductor region.

2. The infrared light-receiving device according to claim 1, wherein
  the second semiconductor region of the optical filter has a first n-type impurity concentration of a first value at a boundary between the first semiconductor region and the second semiconductor region, and a second n-type impurity concentration of a second value at a boundary between the second semiconductor region and the third semiconductor region, the second value being lower than the first value, and
  the second semiconductor region includes a portion in which a concentration profile of the n-type impurity concentration of the second semiconductor region changes monotonously from the first value to the second value in a direction from the first semiconductor region to the third semiconductor region.

3. The infrared light-receiving device according to claim 1, wherein the first semiconductor region, the second semiconductor region, and the third semiconductor region of the optical filter have a first cross-sectional area, a second cross-sectional area, and a third cross-sectional area, respectively, the first cross-sectional area is larger than the second cross-sectional area, the second cross-sectional area is larger than the third cross-sectional area, and the first cross-sectional area, the second cross-sectional area, and the third cross-sectional area are each determined by a plane parallel to the principal surface of the substrate.

4. The infrared light-receiving device according to claim 1, wherein the optical absorption layer has an InGaAs/GaAsSb quantum well structure.

5. The infrared light-receiving device according to claim 1, further comprising:

a first conductivity type semiconductor layer disposed on the substrate, a second conductivity type semiconductor layer disposed on the first conductivity type semiconductor layer, a first electrode in contact with the first conductivity type semiconductor layer, and a second electrode in contact with the second conductivity type semiconductor layer, wherein the optical absorption layer is provided between the first conductivity type semiconductor layer and the second conductivity type semiconductor layer, and the optical filter is disposed on the second conductivity type semiconductor layer in contact with the second conductivity type semiconductor layer.

6. The infrared light-receiving device according to claim 5, wherein the second conductivity type semiconductor layer includes a p-type layer made of InP that is in contact with the optical filter so as to form a p-n junction at a boundary between the second conductivity type semiconductor layer and the optical filter.

* * * * *